(12) United States Patent
Taniguchi et al.

(10) Patent No.: US 7,482,738 B2
(45) Date of Patent: Jan. 27, 2009

(54) PIEZOELECTRIC THIN-FILM RESONATOR AND FILTER

(75) Inventors: Shinji Taniguchi, Kawasaki (JP); Tsuyoshi Yokoyama, Kawasaki (JP); Motoaki Hara, Kawasaki (JP); Takeshi Sakashita, Kawasaki (JP); Jun Tsutsumi, Kawasaki (JP); Masafumi Iwaki, Kawasaki (JP); Tokihiro Nishihara, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/586,731

(22) Filed: Oct. 26, 2006

(65) Prior Publication Data
US 2007/0096597 A1 May 3, 2007

(30) Foreign Application Priority Data
Oct. 27, 2005 (JP) ............................ 2005-312094

(51) Int. Cl.
*H01L 41/08* (2006.01)
(52) U.S. Cl. .................. 310/371; 310/320; 310/324; 310/363; 310/369; 333/187
(58) Field of Classification Search .................. 310/320, 310/321–324, 363–366, 369, 371; 333/186, 333/187, 189
See application file for complete search history.

(56) References Cited

U.S. PATENT DOCUMENTS

| 6,215,375 | B1 |   | 4/2001 | Larson et al. |
| 6,222,304 | B1 | * | 4/2001 | Bernstein ..................... 310/328 |
| 2004/0245892 | A1 | * | 12/2004 | Yamada et al. .............. 310/320 |
| 2005/0099094 | A1 |   | 5/2005 | Nishihara et al. |
| 2005/0264137 | A1 | * | 12/2005 | Taniguchi et al. ........... 310/324 |

FOREIGN PATENT DOCUMENTS

| CN | 1404219 A | 3/2003 |
| CN | 1610254 A | 4/2005 |
| EP | 1 217 734 A2 | 6/2002 |
| EP | 1 315 293 A2 | 5/2003 |
| EP | 1 533 896 A2 | 5/2005 |
| EP | 1 603 234 A1 | 12/2005 |
| EP | 1 684 424 A1 | 7/2006 |
| JP | 60-189307 | 9/1985 |
| JP | 0486182 A1 * | 5/1992 |

(Continued)

OTHER PUBLICATIONS

"Electronic Letters", Jul. 9, 1981, pp. 507-509, vol. 17, No. 14.

(Continued)

*Primary Examiner*—Thomas M Dougherty
(74) *Attorney, Agent, or Firm*—Arent Fox LLP

(57) ABSTRACT

A piezoelectric thin-film resonator includes a lower electrode formed on a substrate to define a rounded dome-shaped cavity between the lower electrode and the substrate, a piezoelectric film provided on the lower electrode, and an upper electrode provided on the piezoelectric film. A membrane region is an overlapping region of the lower electrode and the upper electrode interposing the piezoelectric film and a projected area of the cavity onto the substrate includes the membrane region.

9 Claims, 7 Drawing Sheets

FOREIGN PATENT DOCUMENTS

| | | |
|---|---|---|
| JP | 2000-69594 A | 3/2000 |
| KR | 2003-0013893 A | 2/2003 |

OTHER PUBLICATIONS

Cheol-Hyun Han et al., "Fabrication of Dome-Shaped Diaphragm with Circular Clamped Boundary on Silicon Substrate", Micro Electro Mechanical Systems, 1999. MEMS '99. Twelfth IEEE International Conference on Orland, FL. USA Jan. 17-21,1999, Piscataway, NJ, USA, IEEE, US, Jan. 17, 1999, pp. 505-510, XP0010321770.

* cited by examiner

CAVITY SIZE (LS) – MEMBRANE SIZE (LE)
($\mu$m)

PIEZOELECTRIC THIN-FILM RESONATOR AND FILTER

BACKGROUND OF THE INVENTION

1. Field of the Invention

This invention generally relates to piezoelectric thin-film resonators and filters, and more particularly, to a piezoelectric thin-film resonator with a dome-shaped cavity and a filter.

2. Description of the Related Art

With the rapid spread of wireless devices as represented by mobile telephones, there is an increased demand for small-sized and lightweight resonators and filters that include the resonators used in combination. These days, attention is being focused on piezoelectric thin-film resonators and filters that include the piezoelectric thin-film resonators used in combination, whereas dielectric filters and surface acoustic wave (SAW) filters have mainly been used so far. This is because the piezoelectric thin-film resonators have an excellent characteristic at, in particular, high frequencies, can be reduced in size, and can be fabricated in a monolithic device.

Film Bulk Acoustic Resonator (FBAR) is known as one type of the afore-described piezoelectric thin-film resonators. FBAR has, as main component parts, a body of laminated structure (composite membrane) that includes: an upper electrode (film); a piezoelectric film; and a lower electrode (film). A via hole or cavity is defined in a portion, below the lower electrode, where the upper electrode and the lower electrode oppose each other. Such via hole or cavity is formed by wet or dry etching the backside of a silicon substrate used as a device substrate, or is formed by wet etching a sacrifice layer arranged on the surface of the silicon substrate.

When a high-frequency electric signal is applied between the upper electrode and the lower electrode, elastic waves are excited by the inverse piezoelectric effect or generated by a distortion caused by the piezoelectric effect, in the piezoelectric film. The elastic waves are converted into electric signals. The elastic waves are wholly reflected by the surface of the upper electrode in contact with air and that of the lower electrode in contact with air, resulting in a longitudinal mode thickness excitation having a main displacement in a thickness direction. In the above-described device structure, the resonance occurs at a frequency in which a total film thickness H of the thin-film structure has an integral multiplication (n times) of ½ wavelength of an elastic wave, the thin-film structure having the main component parts composed of the upper electrode film, the piezoelectric film, and the lower electrode film, which are formed above the cavity. A propagation velocity V of the elastic wave varies depending on the material, and a resonance frequency thereof is given by $F=nV/2H$. By using such resonance phenomenon, it is possible to control the resonance frequency with the film thickness as a parameter and to fabricate the resonator and the filter of a desired frequency characteristic.

Here, aluminum (Al), copper (Cu), molybdenum (Mo), tungsten (W), tantalum (Ta), platinum (Pt), ruthenium (Ru), rhodium (Rh), iridium (Ir), chromium (Cr), titanium (Ti), or the like may be used for a metal material of the upper or lower electrodes. Alternatively, the afore-described substances used in combination may be employed as a laminating material. In addition, aluminum nitride (AlN), zinc oxide (ZnO), lead zirconium titanate (PZT), lead titanate ($PbTiO_3$), or the like may be used for the piezoelectric film. In particular, it is desirable to use aluminum nitride (AlN) or zinc oxide (ZnO) with a main axis orientation of (002) plane. Furthermore, silicon, glass, GaAs or the like may be used for a device substrate.

As described above, the piezoelectric thin-film resonator with the above-described configuration, a via hole or cavity needs to be formed immediately below the lower electrode (or the dielectric film). Hereinafter, via hole denotes an opening that penetrates through from the backside of the substrate to the front surface thereof, and cavity denotes an air space existent in the vicinity of the substrate surface or existent immediately below the lower electrode film (or the dielectric film). Conventional piezoelectric thin-film resonators are categorized into the via hole type and cavity type.

FIG. 1 is a cross-sectional view schematically showing the configuration of a conventional piezoelectric thin-film resonator (conventional example 1) described in Electron. Lett., 1981, Number 17, pp. 507-509. In this configuration, on a (100) silicon substrate 11 having a thermally oxidized film ($SiO_2$) 12, there is provided a stacked structure that includes an Au—Cr film serving as a lower electrode 13, a ZnO film serving as a piezoelectric film 14, and an Al film serving as an upper electrode 15. A via hole 16 is formed below the stacked structure. The via hole 16 is formed by anisotropic etching from the backside of the (100) silicon substrate 11, by use of KOH water solution or EDP water solution, which is a compound liquid that includes ethylene diamine, pyrocatechol, and water.

The via hole type of the piezoelectric thin-film resonator shown in FIG. 1 has the following drawbacks. Firstly, the above-described anisotropic etching utilizes the characteristic in which the etch rate of (100) plane of the silicon substrate is higher, to some extent, than that of (111) plane. Therefore, anisotropic etching is an effective method as far as (100) plane is a cut surface of the silicon substrate. Secondly, it is inevitable that the via hole has side walls of a tilt angle of 54.7 degrees, which is an angle formed by intersecting (100) plane with (111) plane. This cannot prevent the device size from becoming larger, and the via hole formed by etching one region of the backside of the silicon substrate widely, decreasing the mechanical strength. Thirdly, when the filter is configured in such a manner that the above-described multiple piezoelectric thin-film resonators are adjacently arranged, the resonators cannot be downsized respectively and the filter cannot be made small to a size suitable for practical use. Fourthly, the via hole formed in the silicon substrate serves as an obstacle in fabricating other devices such as inductance or capacitance on a single substrate, increasing difficulty in integration. Fifthly, a special consideration is needed to avoid damage in weak devices in the dicing process of separating the silicon substrate into the respective chips or in the packaging process of mounting the chip onto a package.

Meanwhile, the cavity type of piezoelectric thin-film resonator has a stacked structure that includes the upper electrode, the piezoelectric film, and the lower electrode (and a dielectric film, if necessary) is provided on the sacrifice layer, and the cavity is formed by etching away the sacrifice layer.

FIG. 2 is a cross-sectional view schematically showing the configuration of the afore-mentioned cavity type of the piezoelectric thin-film resonator (conventional example 2), as disclosed in Japanese Patent Application Publication No. 60-189307. In the afore-mentioned structure, a lower electrode 23, a piezoelectric film 24, and an upper electrode 25 are provided to form a stacked structure, on a substrate 21 having a thermally oxidized film ($SiO_2$) 22. A cavity 26 is provided below the stacked structure. The cavity 26 is formed in such a manner that an island-shaped sacrifice layer of ZnO is patterned in advance, the afore-described stacked structure is provided on such patterned sacrifice layer, and the sacrifice layer arranged below the stacked structure is removed by acid.

In general, in the piezoelectric thin-film resonators that utilize the longitudinal mode thickness excitation such as FBAR, it is a precondition that the piezoelectric film has an excellent orientation in order to obtain an excellent resonance characteristic. In most cases, the cavity depth needs several μm to several tens μm in consideration of oscillation displacement and the deflection in the membrane part. The surface is, however, rough after such thick sacrifice layer is formed, and the orientation of the lower electrode 23 and that of the piezoelectric film 24 are degraded by a great amount, the lower electrode 23 and the piezoelectric film 24 being grown on the sacrifice layer. The stacked body that includes the upper electrode 25, the piezoelectric film 24, and the lower electrode 23 is provided on a bridge-shaped underlying film that protrudes upward from the $SiO_2$ film 22. This causes a problem that the strength is not sufficient with respect to the mechanical vibration and the reliability is not sufficient in practical use.

FIG. 3 is a cross-sectional view schematically showing the piezoelectric thin-film resonator (conventional example 3) disclosed in Japanese Patent Application Publication No. 2000-69594, as a method of addressing the problem in the orientation. The stacked structure is configured such that a lower electrode 33, a piezoelectric film 34, and an upper electrode 35 are formed on a silicon substrate 31 having a thermally oxidized film ($SiO_2$) 32, and a cavity 36 is formed below the stacked structure. Such configured piezoelectric thin-film resonator is fabricated as follows.

Firstly, a dent portion is formed by etching in one region of the surface of the silicon substrate 31. Next, the thermally oxidized film ($SiO_2$) 32 is provided on the surface of the silicon substrate 31 to prevent phosphor in phosphorus silica glass (PSG) used as a sacrifice layer from dispersing in the silicon substrate 31. After PSG of the sacrifice layer is deposited, polishing and cleaning are performed for mirror finishing of the surface. Subsequently, the lower electrode 33, the piezoelectric film 34, and the upper electrode 35 are sequentially stacked, and PSG is lastly removed. In the afore-described fabrication method of the piezoelectric thin-film resonator, however, the fabrication costs are high. In addition, the fabrication method includes a troublesome polishing process that requires the process of removing the slurry residue, and the productivity is inferior due to a number of fabrication processes.

SUMMARY OF THE INVENTION

The present invention has been made in view of the above circumstances and provides a piezoelectric thin-film resonator and a filter, which are excellent in mechanical strength, reliability, and productivity, and which have an excellent orientation in a piezoelectric film and have an excellent performance.

According to one aspect of the present invention, there is provided a piezoelectric thin-film resonator including: a lower electrode formed on a substrate to define a rounded dome-shaped cavity between the lower electrode and the substrate; a piezoelectric film provided on the lower electrode; and an upper electrode provided on the piezoelectric film. A membrane region is an overlapping region of the lower electrode and the upper electrode interposing the piezoelectric film; and a projected area of the cavity onto the substrate includes the membrane region. It is possible to provide a piezoelectric thin-film resonator that is excellent in mechanical strength, reliability, and productivity, and has a piezoelectric film excellent orientation and excellent performance.

According to another aspect of the present invention, there is provided a filter having the above-described multiple thin-film resonators used in combination.

BRIEF DESCRIPTION OF THE DRAWINGS

Preferred exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Exemplary Embodiment

Figure 1:
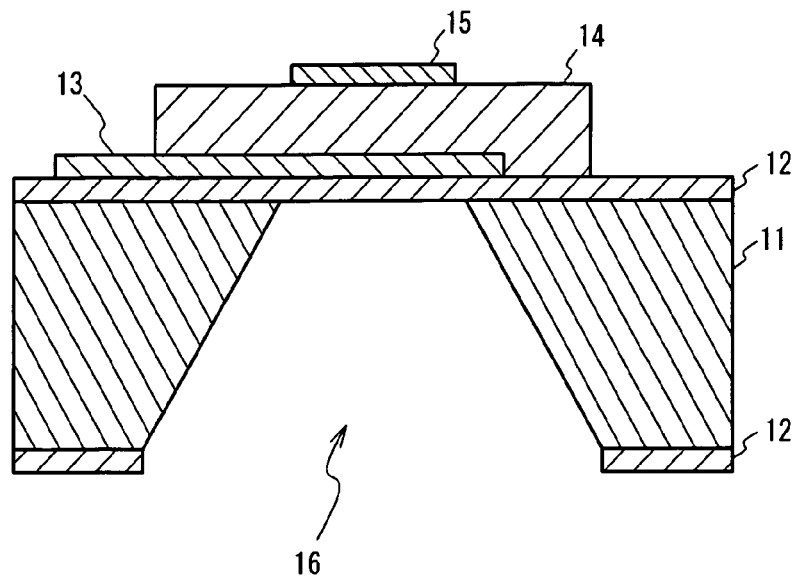
FIG. 1 is a cross-sectional view schematically showing the configuration of a conventional piezoelectric thin-film resonator of conventional example 1.
Figure 2:
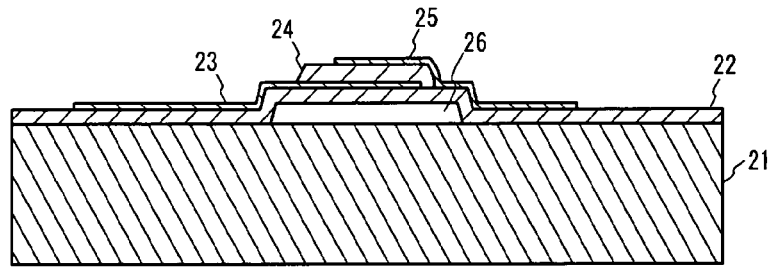
FIG. 2 is a cross-sectional view schematically showing the configuration of a conventional piezoelectric thin-film resonator of conventional example 2.
Figure 3:
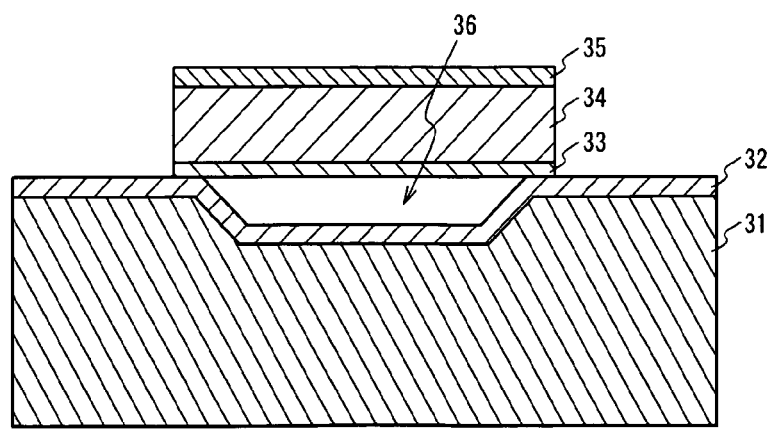
FIG. 3 is a cross-sectional view schematically showing the configuration of a conventional piezoelectric thin-film resonator of conventional example 3.
Figure 4A:
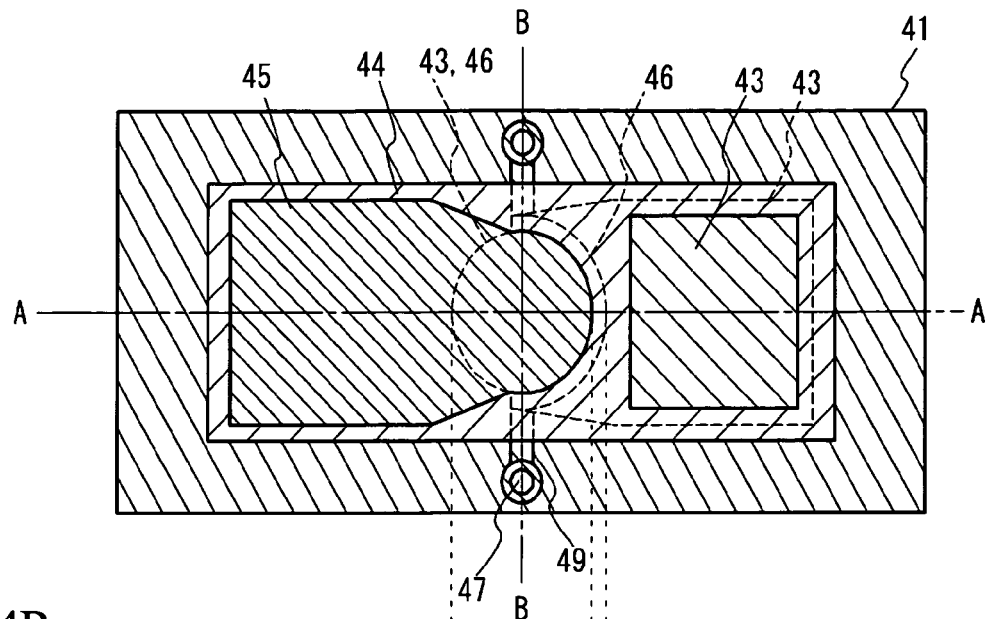
FIG. 4A is a plane view of a piezoelectric thin-film resonator in accordance with a first exemplary embodiment of the present invention.
Figure 4B:
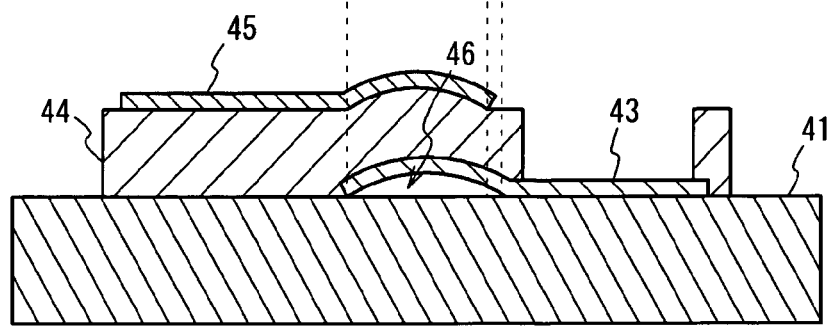
FIG. 4B is a cross-sectional view taken along the line A-A shown in FIG. 4A.
Figure 4C:
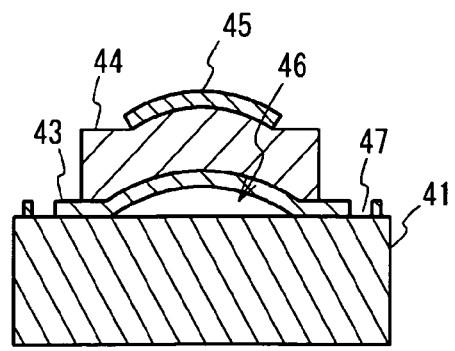
FIG. 4C is a cross-sectional view taken along the line B-B shown in FIG. 4A.

FIG. 4A is a plane view of a piezoelectric thin-film resonator in accordance with a first exemplary embodiment of the present invention. FIG. 4B is a cross-sectional view taken along the line A-A shown in FIG. 4A. FIG. 4C is a cross-sectional view taken along the line B-B shown in FIG. 4A. Referring to FIG. 4A through FIG. 4C, a lower electrode 43 is formed on a silicon substrate 41 so that a rounded and dome-shaped cavity 46 is provided between the substrate 41 and the lower electrode 43. The rounded and dome-shaped cavity 46 is formed in such a manner that the cavity is lower in the periphery thereof and becomes higher toward the center thereof. The lower electrode 43, a piezoelectric film 44, and an upper electrode 45 form a composite membrane. The lower electrode 43 and the upper electrode 45 may employ Ru, and the piezoelectric film 44 may employ AlN and has a main axis orientation of (002) direction. The membrane region corresponds to an overlapping region of the lower electrode 43 and the upper electrode 45 interposing the piezoelectric film 44. As shown in FIG. 4A, the lower electrode 43 is provided with an introduction path 49 running in B-B direction to etch a sacrifice layer, described later. Ends of the introduction path 49 and the vicinity thereof are not covered with the piezoelectric film 44, and the lower electrode 43 is also provided with openings 47 at the ends of the introduction path 49. The piezoelectric film 44 is provided with an opening to be electrically coupled the lower electrode 43 to the outside.

Figure 5E:
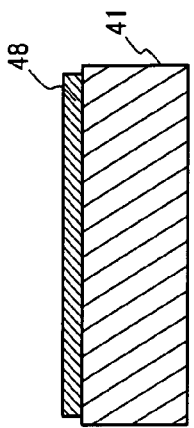
FIG. 5A through FIG. 5H are cross-sectional views illustrating fabrication processes of the piezoelectric thin-film resonator in accordance with the first exemplary embodiment of the present invention.
Figure 5F:
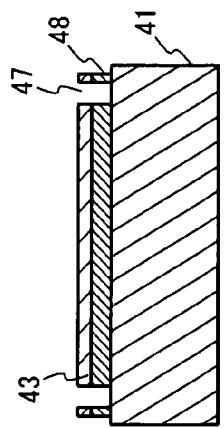
Figure 5G:
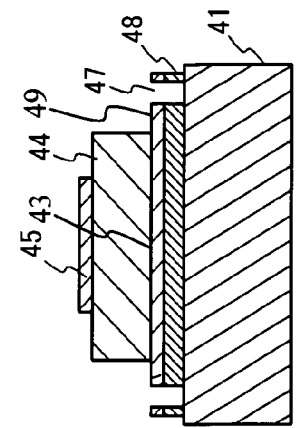
Figure 5H:
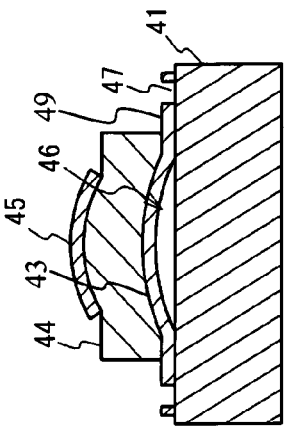
Figure 5A:
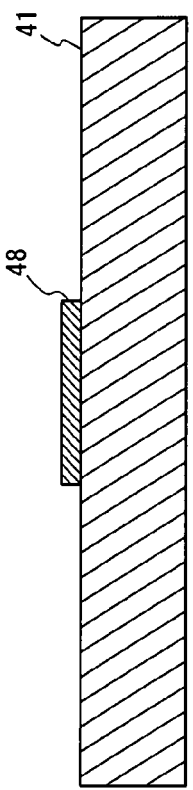

FIG. 5A through FIG. 5H are cross-sectional views illustrating fabrication processes of the piezoelectric thin-film resonator in accordance with the first exemplary embodiment of the present invention. FIG. 5A through FIG. 5D are cross-sectional views taken along the line A-A shown in FIG. 4A. FIG. 5E through FIG. 5H are cross-sectional views taken along the line B-B shown in FIG. 4A. Referring now to FIG. 5A and FIG. 5E, a sacrifice layer 48 made, for example, of MgO or the like having a thickness of approximately 20 nm is deposited on the silicon substrate 41, for example, by means of sputtering or vapor deposition method. In addition to a silicon substrate stated above, a quartz substrate, glass substrate, GaAs substrate, or the like may be employed for the substrate 41. In particular, while the cavity 46 is being formed, the substrate 41 is not etched unlike the conventional examples 1 and 3. This permits the use of a substrate difficult for etching, in the present exemplary embodiment. Preferably, a substance that is an easily soluble into an etchant, for example, such as ZnO, Ge, Ti, or the like is employed as the sacrifice layer 48. The sacrifice layer 48 is formed to have a given shape by use of the lithography and etching techniques.

Figure 6A:
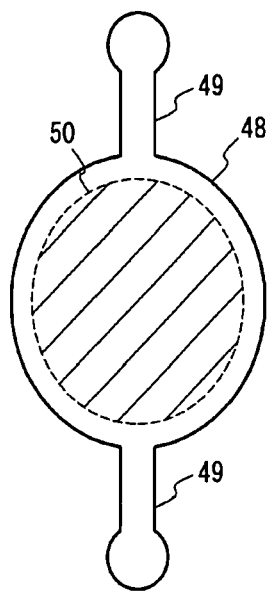
FIG. 6A through FIG. 6C are plane views showing a sacrifice layer and a membrane region.

At this point, FIG. 6A is a plane view showing a region in which the sacrifice layer 48 is formed (hereinafter, simply referred to as sacrifice layer 48) and another region to become a membrane region 50 (hereinafter, simply referred to as membrane region 50). The sacrifice layer 48 is provided to include the membrane region 50. There are two introduction paths 49 to introduce the etchant to remove the sacrifice layer 48. One introduction path 49 or three or more introduction paths 49 may be provided.

Figure 5B:
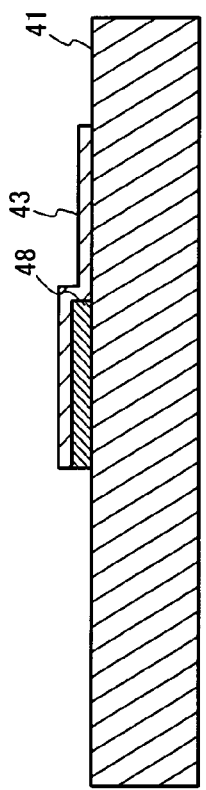
Figure 6B:
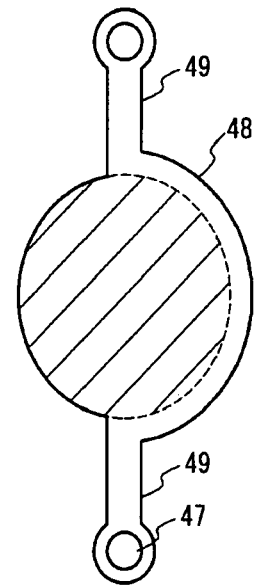

Referring to FIG. 5B and FIG. 5F, the lower electrode 43 made of Ru and having a thickness of 100 nm is formed by the sputtering method in Ar gas atmosphere at a pressure of approximately 0.6 Pa to 1.2 Pa. The above-described metals may be employed for the lower electrode 43. The lower electrode 43 is formed to have a given shape, by use of the lithography and ion milling techniques. FIG. 6B is a plane view showing the sacrifice layer 48 and the membrane region 50 at this point. The sacrifice layer 48 on which the lower electrode 43 is not provided is removed at the time of etching the lower electrode 43. As a result, on the left side of FIG. 6B, the outline of the sacrifice layer 48 corresponds to that of the shape of the lower electrode 43, that is, the outline of the membrane region 50. Meanwhile, on the right side of FIG. 6B, the region to become the lower electrode 43 covers the sacrifice layer 48 composed of the membrane region 50 and the vicinity thereof. For this reason, the sacrifice layer 48 of the vicinity of the membrane region 50 is not removed during the etch process of the lower electrode 43. Consequently, the outline of the sacrifice layer 48 corresponds to that of the membrane region 50 on the left side of the membrane region 50. The sacrifice layer 48 includes the membrane region 50 on the right side of thereof. The openings 47 are formed at the ends of the introduction path 49. The openings 47 may be formed later.

Figure 5C:
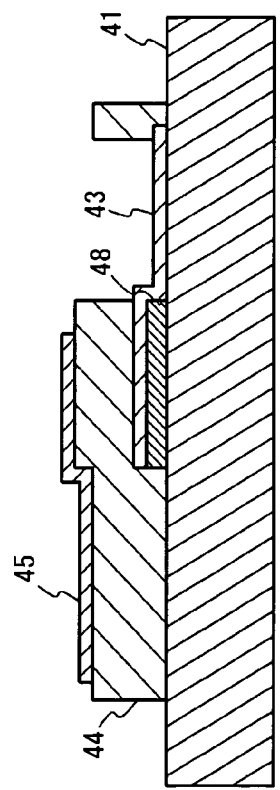

Referring to FIG. 5C and FIG. 5G, the piezoelectric film 44 made of an AlN film with a main axis orientation of (002) direction and having a thickness of approximately 400 nm is formed on the lower electrode 43 and on the substrate 41, by the sputtering method in a mixed gas atmosphere that includes Ar and $N_2$ at a pressure of approximately 0.3 Pa. The upper electrode 45 made of Ru and having a thickness of approximately 100 nm is formed on the piezoelectric film 44, by the sputtering method in an Ar gas atmosphere at a pressure of approximately 0.6 Pa to 1.2 Pa. A piezoelectric material such as ZnO or the like may be used for the piezoelectric film 44, as described. A metal similar to the lower electrode 43 may be used for the upper electrode 45. The upper electrode 45 and the piezoelectric film 44 are formed to have given shapes with the use of lithography and etching techniques. At this time, as shown in FIG. 5C, an opening is provided in the piezoelectric film 44 on the lower electrode 43 so as to electrically couple the lower electrode 43 to the outside. As shown in FIG. 5G, neither the piezoelectric film 44 nor the upper electrode 45 is provided at the ends of the introduction path 49.

Figure 5D:
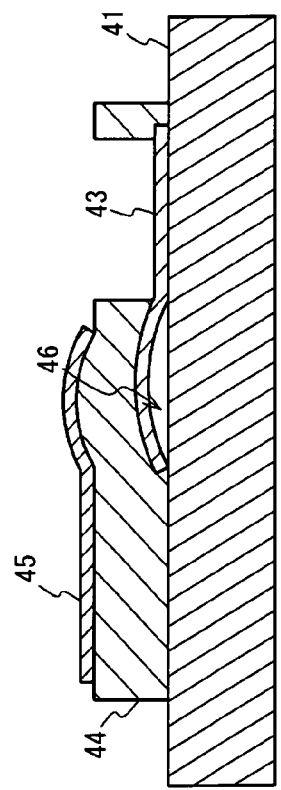

Referring to FIG. 5D and FIG. 5H, the etchant used for etching the sacrifice layer 48 is introduced from the openings 47 through the introduction path 49 to remove the sacrifice layer 48. Here, the composite membrane that includes the lower electrode 43, the piezoelectric film 44, and the upper electrode 45 is configured to exert a compression stress. This swells up the composite membrane to form the cavity 46 between the lower electrode 43 and the substrate 41, at the time when the etching process is completed at the sacrifice layer 48. The cavity 46 has a dome shape and is rounded on the side of the composite membrane. Here, in the first exemplary embodiment, the compression stress of the composite membrane is configured to be −300 MPa.

Figure 6C:
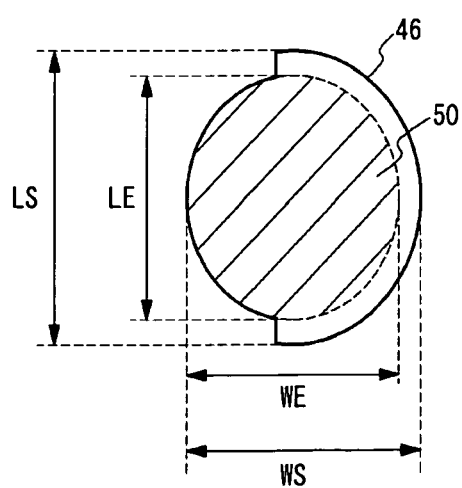

FIG. 6C illustrates the membrane region 50 and a projected area of the cavity 46 onto the substrate 41 (hereinafter, simply referred to as the cavity 46), in the piezoelectric thin-film resonator employed in the first exemplary embodiment. The membrane region 50 has a shape of an ellipse. The outline of the membrane region 50 coupled to the upper electrode 45 corresponds to that of the cavity 46 on the left side of FIG. 6C. Meanwhile, the outline of the membrane region 50 coupled to the lower electrode 43 is included in the outline of the cavity 46. The projected area of the cavity 46 onto the substrate 41 includes the membrane region 50. Here, LE represents a width of a longitudinal direction of the membrane region 50, WE represents a width of a lateral direction of the membrane region 50, LS represents a width of a longitudinal direction of the cavity 46, and WS represents a width of a lateral direction of the cavity 46. In the first exemplary embodiment, for example, LM is set to 150 μm and LS is set to 125 μm. In FIG. 5B and FIG. 5F, while the lower electrode 43 is being etched, the sacrifice layer 48 is also etched. So, the outline of the membrane region 50 corresponds to that of the cavity 46 on the left side of the cavity 46 in FIG. 6C. The outline of the membrane region 50 may be configured to include the outline of the cavity 46 also on the left side of the cavity 46 so that the sacrifice layer 48 is not etched while the lower electrode 43 is being etched.

Figure 7:
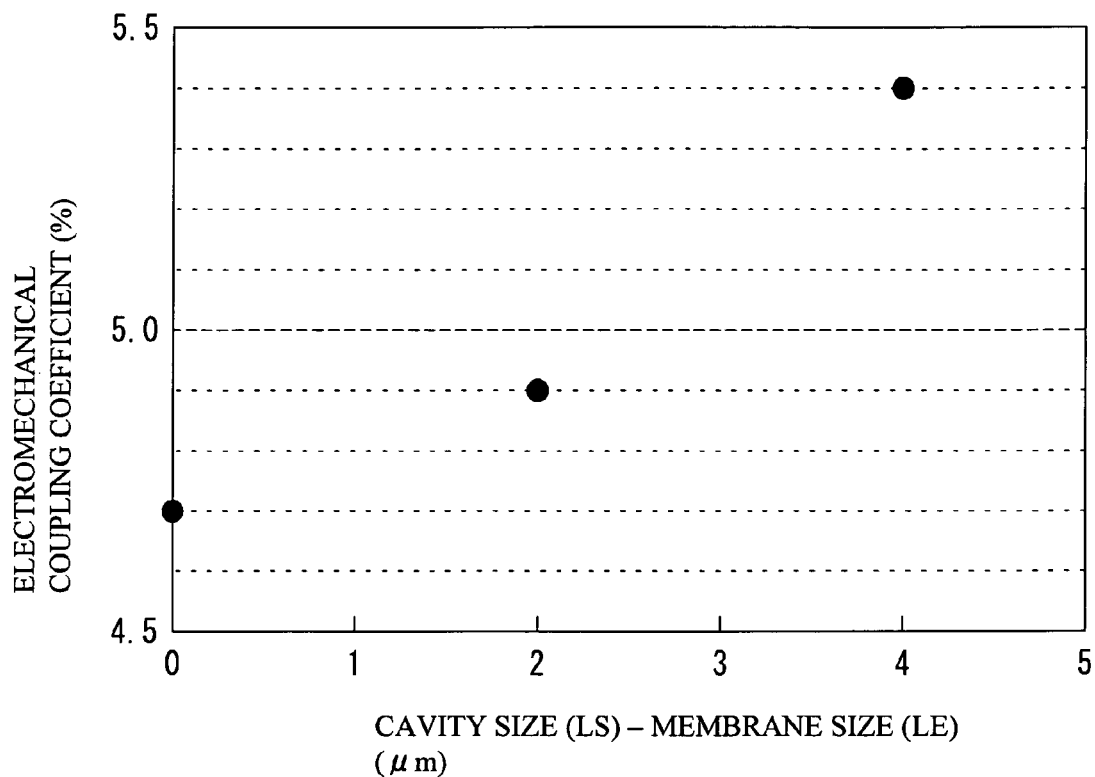
FIG. 7 is a view showing the electromechanical coupling coefficient of the piezoelectric thin-film resonator employed in the first exemplary embodiment of the present invention.

FIG. 7 is a view showing the electromechanical coupling coefficient of the piezoelectric thin-film resonator, with respect to the value subtracted the size of the membrane region (LE) from the size of the cavity (LS). Here, LS−LE is approximately double WS−WE. The electromechanical coupling coefficient becomes greater, when LS−LE is greater. The inventors of the present invention have found that the electromechanical coupling coefficient is excellent when LS−LE is up to approximately 10 μm. The electromechanical coupling coefficient can be increased by including the membrane region 50 in the cavity 46, thereby increasing the resonance characteristic. Meanwhile, when the rounded dome-shaped cavity 46 is smaller than the membrane region 50, the shape of the cavity 46 is defective, or the insertion loss is degraded even when the cavity can be formed. The stable resonance characteristic is not available.

In the first exemplary embodiment, the cavity 46 has a dome shape on the side of the composite membrane. This eliminates the necessity of etching the substrate 41 unlike the conventional examples 1 and 2, and the productivity can be improved. The mechanical strength can be also improved. Furthermore, the region to form the cavity 46 can be made small, which is useful in integration. The size of the cavity 46 can be made smaller than that of the conventional example 2, thereby suppressing the reliability degradation cause by the mechanical vibration of the composite membrane. The sacrifice layer 48 to form the cavity 46 can be made thinner, ensuring the excellent orientation of the piezoelectric film 44 in a similar manner to the conventional examples 1 and 3. In addition, as shown in FIG. 7, the projected area of the cavity 46 onto the substrate 41 includes the membrane region 50, improving the resonance characteristic of the piezoelectric thin-film resonator to obtain an excellent performance thereof.

Figure 8A:
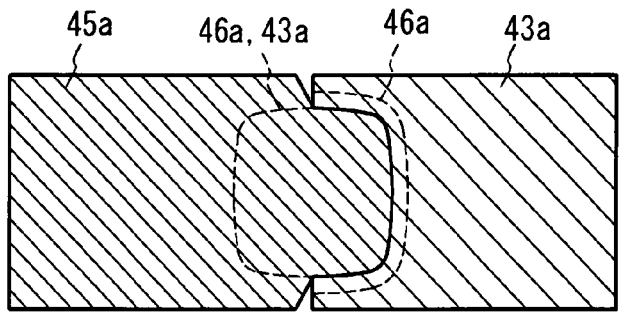
FIG. 8A and FIG. 8B show variations of the employed in the first exemplary embodiment of the present invention.
Figure 8B:
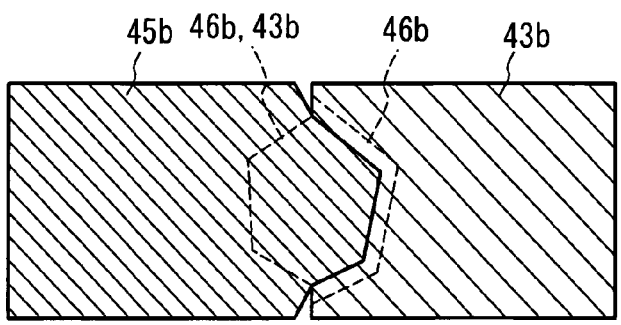

As in the first exemplary embodiment, preferably, the outline of the projected area of the cavity 46 onto the substrate 41 includes a curved line. This is because the curved line can suppress the concentration of the stress on a specific side. This can both ensure the strength of the composite membrane and reduce the variations of the resonance characteristic. More preferably, the whole outline is made of one or more curved lines. It is preferable that the shape of an ellipse or circle is employed, because the stress is not concentrated. For example, FIG. 8A is an example showing a lower electrode 43a, an upper electrode 45a, and a cavity 46a. The cavity 46a may be configured with four sides (square) of curved lines, as shown in FIG. 8A. In addition to the afore-described square shape, the cavity 46a may employ a polygonal shape composed of curved lines. FIG. 8B is an example showing a lower electrode 43b, an upper electrode 45b, and a cavity 46b. The outline of the projected area of the cavity 46b onto the substrate 41 has a polygonal shape composed of sides that are not parallel to one another. Also in the afore-mentioned case, it is possible to suppress the concentration of the stress on a specific side.

In addition, as in the first exemplary embodiment, it is preferable that the outline of the membrane region should be a curved line. This is because the influence of the vibration in the lateral direction can be decreased. The shape of an ellipse or circle is preferable to decrease the influence of the vibration in the lateral direction. For example, as shown in FIG. 8A, the membrane region, namely, the overlapping region of the lower electrode 43a and the upper electrode 45a, may have a polygonal shape composed of curved sides. Also, as shown in FIG. 8B, the membrane region, namely, the overlapping region of the lower electrode 43b and the upper electrode 45b, may have a polygonal shape composed of sides that are not parallel to one another. Also in the afore-described case, the influence of the vibration in the lateral direction can be decreased.

The composite membrane that includes the lower electrode 43, the piezoelectric film 44, and the upper electrode 45 is configured to exert the compression stress. This makes it possible to form the rounded dome-shaped cavity 46 without collapse. The openings 47 are provided in the lower electrode 43. The rounded dome-shaped cavity 46 can be formed by etching the sacrifice layer 48 by use of the openings 47.

The piezoelectric thin-film resonator with an excellent resonance characteristic can be provided by employing aluminum nitride or zinc oxide with a main axis orientation of (002) plane.

Second Exemplary Embodiment

Figure 9A:
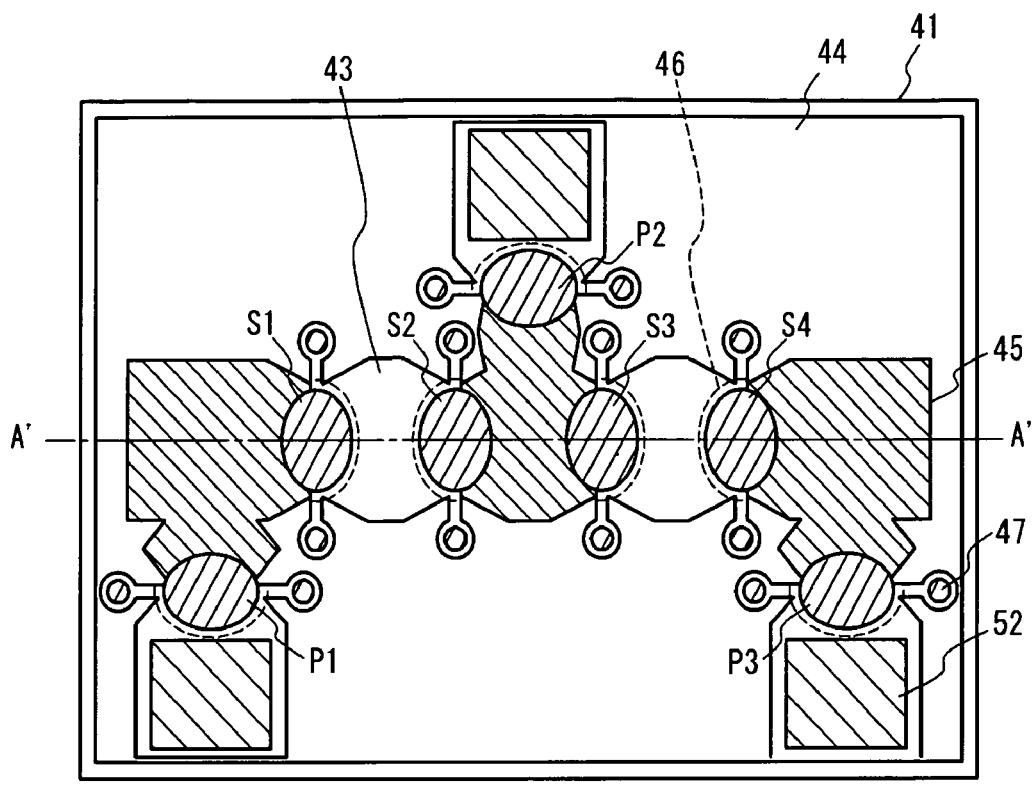
FIG. 9A is a top view of a filter in accordance with a second exemplary embodiment of the present invention.
Figure 9B:
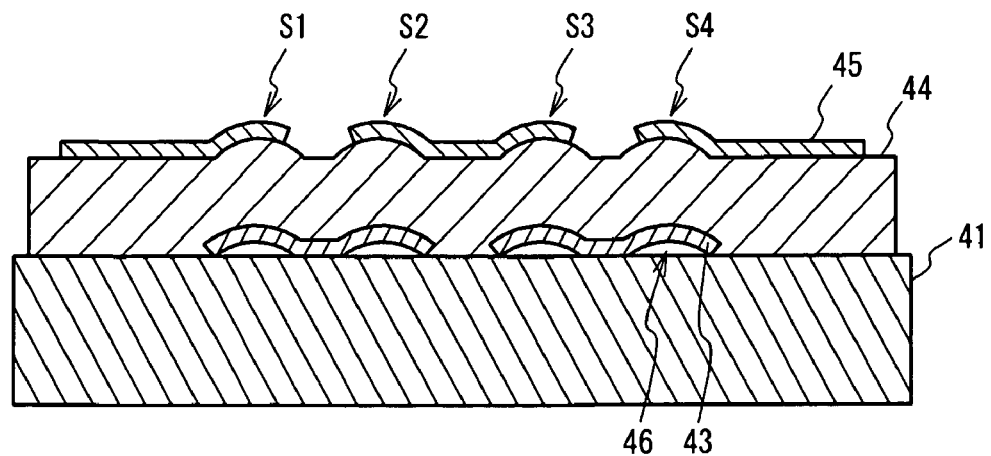
FIG. 9B is a cross-sectional view taken along the line A'-A' shown in FIG. 9A.

A second exemplary embodiment of the present invention is an example of a filter that includes multiple piezoelectric thin-film resonators employed in the first exemplary embodiment. FIG. 9A is a top view of a filter in accordance with a second exemplary embodiment of the present invention. FIG. 9B is a cross-sectional view taken along the line A'-A' shown in FIG. 9A. In the second exemplary embodiment, the same components and configurations as those employed in the first exemplary embodiment have the same reference numerals and a detailed explanation will be omitted. The filter shown in FIG. 9 is a ladder-type filter composed of four series-arm resonators and three parallel-arm resonators. S1 through S4 are the membrane regions of the series-arm resonators, and P1 through P3 are the membrane regions of the parallel-arm resonators. The piezoelectric film 44 is provided with openings 52 to be electrically coupled to the lower electrode 43. Each of the above-described resonators has a rounded dome-shaped cavity 46 and a membrane region. An additional film, not shown, made, for example, of Ti, is formed on the upper electrode 45 of the membrane regions P1 through P3, in order to reduce the resonance frequency of the parallel-arm resonators and obtain the characteristic of the band-pass filter.

Figure 10:
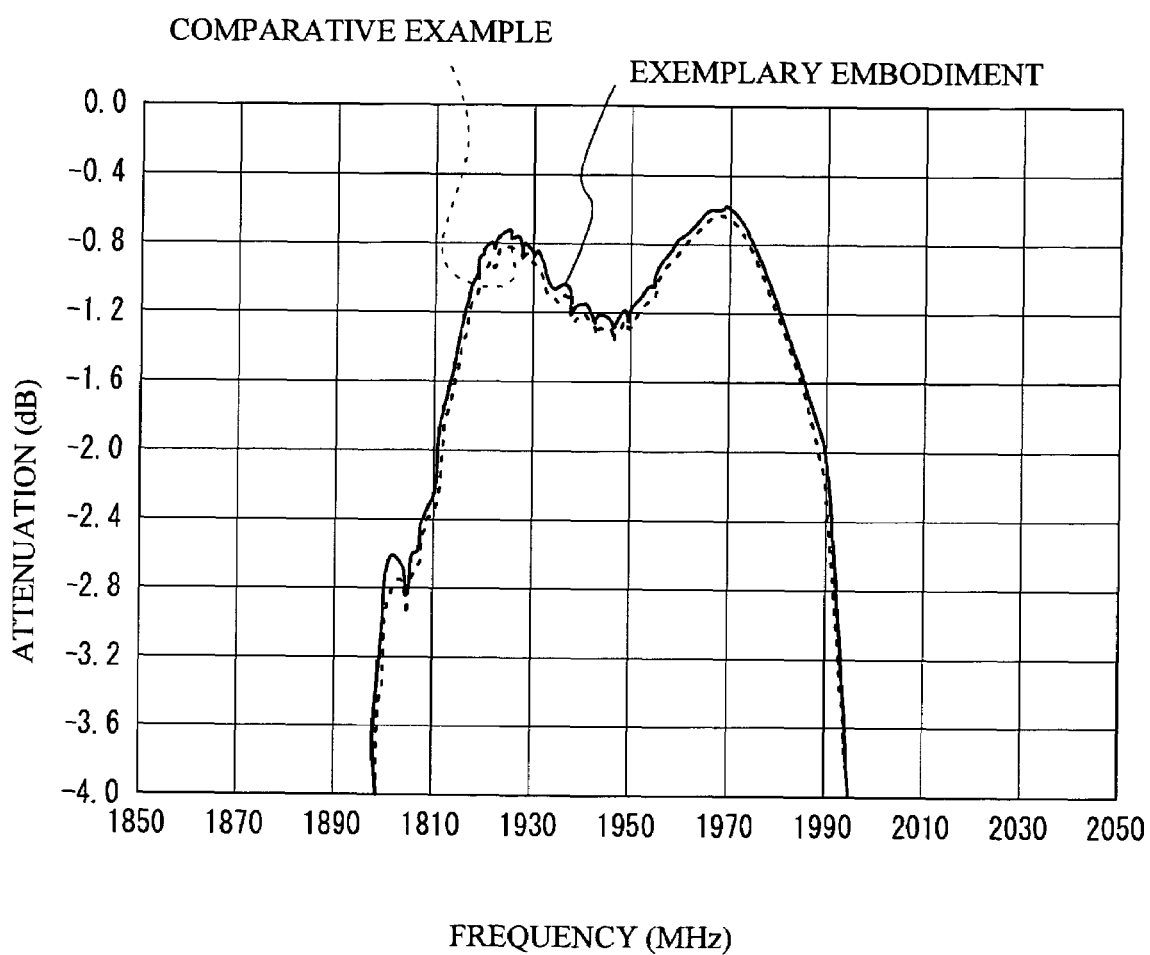
FIG. 10 is a view showing the passband characteristic of the filter employed in the second exemplary embodiment of the present invention.

FIG. 10 is a view showing the passband characteristic of the filter employed in the second exemplary embodiment and illustrating the attenuation with respect to the frequency. In FIG. 10, the exemplary embodiment represents the filter characteristic employed in the second exemplary embodiment, and the comparative example represents a filter having a same configuration as that employed in the second exemplary embodiment except that the shape of membrane region corresponds to that of the cavity. As shown in FIG. 10, in the second exemplary embodiment, the passband characteristic is improved over the pass band. Ripple is also improved in the pass band because of the improved electromechanical coupling coefficient of the resonator. According to the experiments of the inventors of the present invention, in the filter employed in the second exemplary embodiment except that the rounded dome-shaped cavity 46 is smaller than the membrane region 50, the shape of the cavity 46 is defective or the insertion loss is degraded even when the cavity can be formed. The stable characteristic is not obtainable. However, an excellent characteristic is obtainable in the filter employed in the second exemplary embodiment. The piezoelectric thin-film resonator employed in the first exemplary embodiment may be applicable to any filter other than the ladder-type ones. Also in the afore-described case, the filter characteristic can be improved.

As stated heretofore, by configuring the filter to include multiple piezoelectric thin-film resonators employed in the first exemplary embodiment, it is possible to obtain the filter that is excellent in the mechanical strength, reliability, and productivity and that has an excellent orientation and excellent performance of the piezoelectric film.

The present invention is based on Japanese Patent Application No. 2005-312094 filed on Oct. 27, 2005, the entire disclosure of which is hereby incorporated by reference.

What is claimed is:

1. A piezoelectric thin-film resonator comprising:
   a lower electrode formed on a substrate to define a rounded dome-shaped cavity between the lower electrode and the substrate;
   a piezoelectric film provided on the lower electrode; and
   an upper electrode provided on the piezoelectric film, wherein:
   a membrane region is an overlapping region of the lower electrode and the upper electrode interposing the piezoelectric film; and
   a projected area of the cavity onto the substrate is larger than the membrane region and includes all of the membrane region.

2. The piezoelectric thin-film resonator as claimed in claim 1, wherein an outline of the projected area of the cavity includes a curved line.

3. The piezoelectric thin-film resonator as claimed in claim 1, wherein an outline of the projected area of the cavity is a polygonal shape composed of sides that are not parallel to one another.

4. The piezoelectric thin-film resonator as claimed in claim 1, wherein an outline of the membrane region is composed of a curved line.

5. The piezoelectric thin-film resonator as claimed in claim 1, wherein an outline of the membrane region is a polygonal shape composed of sides that are not parallel to one another.

6. The piezoelectric thin-film resonator as claimed in claim 1, wherein a composite membrane composed of the lower electrode, the piezoelectric film, and the upper electrode is configured to have a compression stress so that the rounded dome-shaped cavity is defined between the lower electrode and the substrate.

7. The piezoelectric thin-film resonator as claimed in claim 1, wherein openings are provided in the lower electrode.

8. The piezoelectric thin-film resonator as claimed in claim 1, wherein the piezoelectric film is any of aluminum nitride and zinc oxide with a main axis orientation of (002) direction.

9. A filter having multiple thin-film resonators used in combination, each of the piezoelectric thin-film resonators comprising:
   a lower electrode formed on a substrate to define a rounded dome-shaped cavity between the lower electrode and the substrate;
   a piezoelectric film provided on the lower electrode; and
   an upper electrode provided on the piezoelectric film, wherein:
   a membrane region is an overlapping region of the lower electrode and the upper electrode interposing the piezoelectric film; and
   a projected area of the cavity onto the substrate is larger than the membrane region and includes all of the membrane region.

* * * * *